(12) United States Patent
Kim et al.

(10) Patent No.: US 8,848,469 B2
(45) Date of Patent: Sep. 30, 2014

(54) SEMICONDUCTOR DEVICE AND TESTING METHOD THEREOF

(75) Inventors: Bo-Yeun Kim, Gyeonggi-do (KR); Ji-Eun Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 340 days.

(21) Appl. No.: 13/333,715

(22) Filed: Dec. 21, 2011

(65) Prior Publication Data

US 2013/0107646 A1    May 2, 2013

(30) Foreign Application Priority Data

Oct. 28, 2011   (KR) .......................... 10-2011-0111324

(51) Int. Cl.
*G11C 29/00* (2006.01)
*G11C 29/44* (2006.01)

(52) U.S. Cl.
CPC ............ *G11C 29/785* (2013.01); *G11C 29/802* (2013.01); *G11C 2029/4402* (2013.01)
USPC ... 365/200; 365/201; 365/225.7; 365/230.03; 365/230.06

(58) Field of Classification Search
CPC .... G11C 29/00; G11C 29/024; G11C 29/886; G11C 2029/00
USPC ............ 365/200, 201, 225.7, 230.03, 230.06
See application file for complete search history.

(56) References Cited

U.S. PATENT DOCUMENTS

| | | | | |
|---|---|---|---|---|
| 6,834,016 | B2 * | 12/2004 | Kato et al. ..................... | 365/200 |
| 2007/0147145 | A1 * | 6/2007 | Koo .............................. | 365/200 |
| 2011/0149665 | A1 * | 6/2011 | Koo .............................. | 365/200 |
| 2011/0158012 | A1 * | 6/2011 | Kim et al. ..................... | 365/200 |
| 2011/0205819 | A1 * | 8/2011 | Seo et al. ...................... | 365/200 |

* cited by examiner

*Primary Examiner* — Toan Le
(74) *Attorney, Agent, or Firm* — IP & T Group LLP

(57) ABSTRACT

A semiconductor device includes a plurality of cell blocks activated in response to a plurality of selection signals, respectively, a pre-selection signal generator configured to generate a plurality of pre-selection signals corresponding to the cell blocks, respectively, and activate at least two of the pre-selection signals by decoding addresses in a multi-test mode, a selection signal controller configured to selectively activate the plurality of selection signals in response to the plurality pre-selection signals and control active periods of the activated selection signals so as not to overlap, and a decision circuit configured to decide whether or not the cell blocks activated in response to the activated selection signals are repaired in response to stored repair information and the plurality of selection signals.

20 Claims, 6 Drawing Sheets

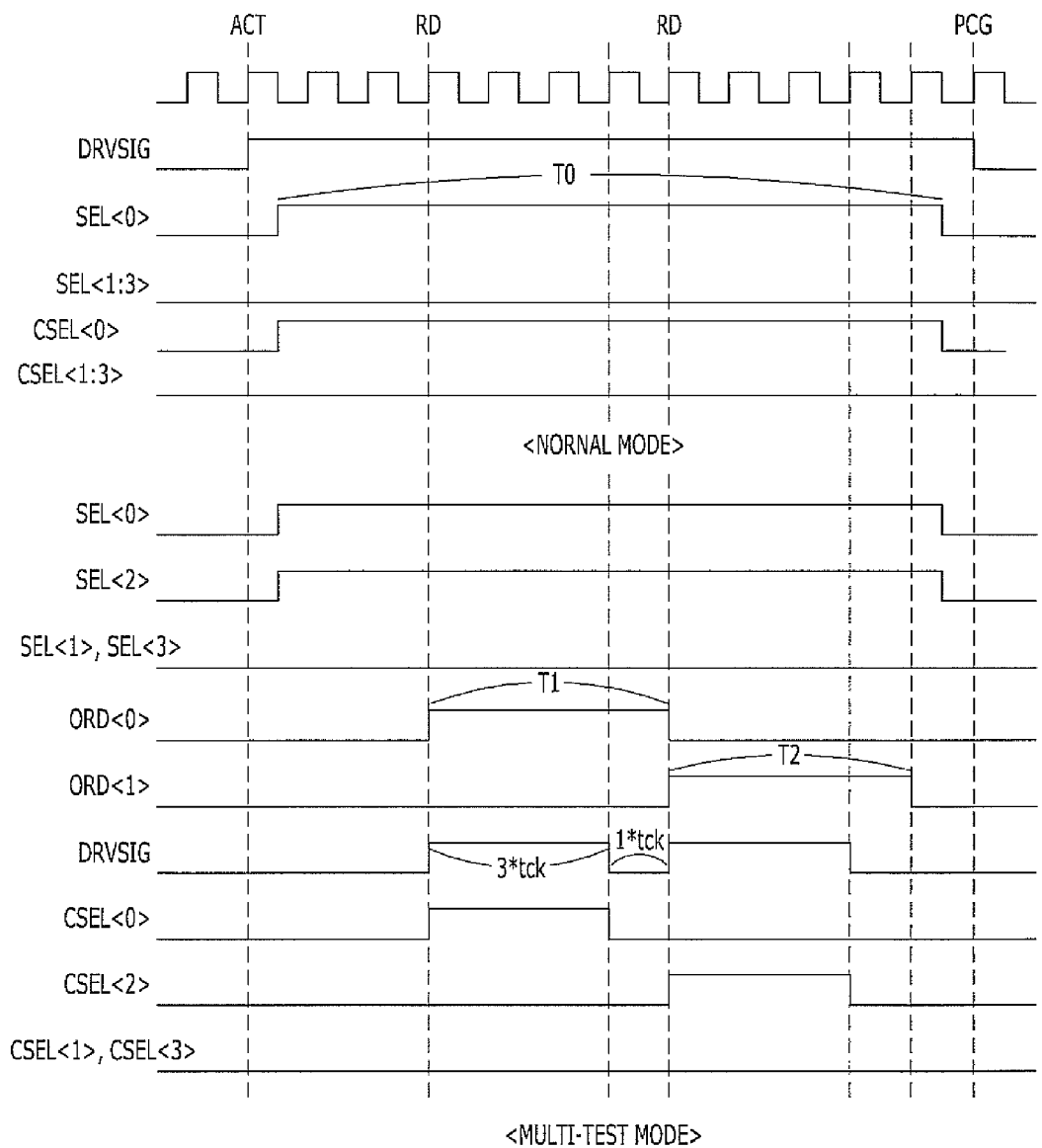

SEMICONDUCTOR DEVICE AND TESTING METHOD THEREOF

CROSS-REFERENCE TO RELATED APPLICATIONS

The present application claims priority of Korean Patent Application No. 10-2011-0111324, filed on Oct. 28, 2011, which is incorporated herein by reference in its entirety.

BACKGROUND

1. Field

Exemplary embodiments of the present invention relate to a semiconductor device for a multi-test mode and a testing method thereof.

2. Description of the Related Art

As the integration of semiconductor devices such as memory devices (DRAM and flash memory) increases, more time and costs incur in testing the semiconductor devices. Particularly, a test for deciding the presence of defective memory cells takes a considerable time.

In a general testing operation of a defective cell, an activating operation of cell blocks, a read (or write) operation and a pre-charging operation are sequentially performed. Here, the cell block includes at least one word line. First, one of a plurality of cell blocks is activated by decoding an inputted address ADD<0:M>. Specifically, one of word lines constituting the activated cell block is activated. A read or write operation is performed on a cell block activated in response to a read or write command. Subsequently, a pre-charging operation is performed. The operations described above are repeatedly performed on all the word lines constituting the activated cell block.

A multi-test method for testing the presence of defect of a memory cell by activating a plurality of cell blocks is used to reduce a test time of defective cells. In the multi-test method, an active operation and a pre-charge operation can be simultaneously performed on the plurality of cell blocks, so that the overall test time can be reduced.

Meanwhile, in order to increase a yield of memory cells, when a defect occurs in a memory cell of a general semiconductor device, a cell block including the defective cell is replaced with a redundancy cell block separately provided in the memory device. After a specific cell block is repaired, an inputted address indicating the specific cell block and a stored repair address indicating the repaired cell block are compared through a decision circuit. If both the addresses are identical to each other, the cell block indicated by the inputted address is decided as a defective cell block. Subsequently, the redundancy cell block is activated in place of the cell block indicated by the inputted address, and a read (or write) operation is performed on the activated cell block. On the contrary, if the inputted address is different from the stored repair address, the cell block indicated by the inputted address is decided as a normal cell block, and a read (or write) operation is performed on the cell block indicated by the inputted address.

In a multi-test mode, at least two cell blocks of N cell blocks are simultaneously activated. However, since a plurality of cell blocks are simultaneously activated in the multi-test mode, a plurality of signals respectively indicating the plurality of cell blocks are simultaneously inputted to a decision circuit and cause an inaccurate decision operation.

SUMMARY

An embodiment of the present invention is directed to a semiconductor device capable of normally deciding the presence of repair of cell blocks in a multi-test mode.

In accordance with an embodiment of the present invention, a semiconductor device includes a plurality of cell blocks activated in response to a plurality of selection signals, respectively; a pre-selection signal generator configured to generate a plurality of pre-selection signals corresponding to the cell blocks, respectively, and activate at least two of the pre-selection signals by decoding addresses in a multi-test mode; a selection signal controller configured to selectively activate the plurality of selection signals in response to the plurality pre-selection signals and control active periods of the activated selection signals so as not to overlap; and a decision circuit configured to decide whether or not the activated cell blocks are repaired in response to stored repair information and the activated selection signals.

In accordance with another embodiment of the present invention, a testing method of a semiconductor device having a plurality of cell blocks that are activated in response a plurality of selection signals, respectively, the method comprising: generating a plurality of pre-selection signals corresponding to the cell blocks, respectively, and activating at least two of the pre-selection signals by decoding addresses in a multi-test mode; selectively activating the selection signals in response to the plurality pre-selection signals and controlling active periods of the activated selection signals so as not to overlap; and deciding whether or not the activated cell blocks are repaired in response to stored repair information stored and the activated selection signals.

In accordance with still another embodiment of the present invention, a semiconductor device includes a driving control signal generator configured to generate a driving control signal in response to a read or write command in a test mode; a pre-selection signal generator configured to generate a plurality of pre-selection signals, and activate at least two of the pre-selection signals by decoding addresses in the test mode; a selection signal controller configured to selectively activate a plurality of selection signals in response to a plurality pre-selection signals and control active periods of the activated selection signals so as not to overlap; and a decision circuit configured to receive the plurality of selection signals to decide a logic level of a hit signal in response to stored repair information and the driving control signal.

BRIEF DESCRIPTION OF THE DRAWINGS

FIG. 5 is a timing diagram illustrating an entire operation of the semiconductor device illustrated in FIG. 1.

DETAILED DESCRIPTION

Figure 1:
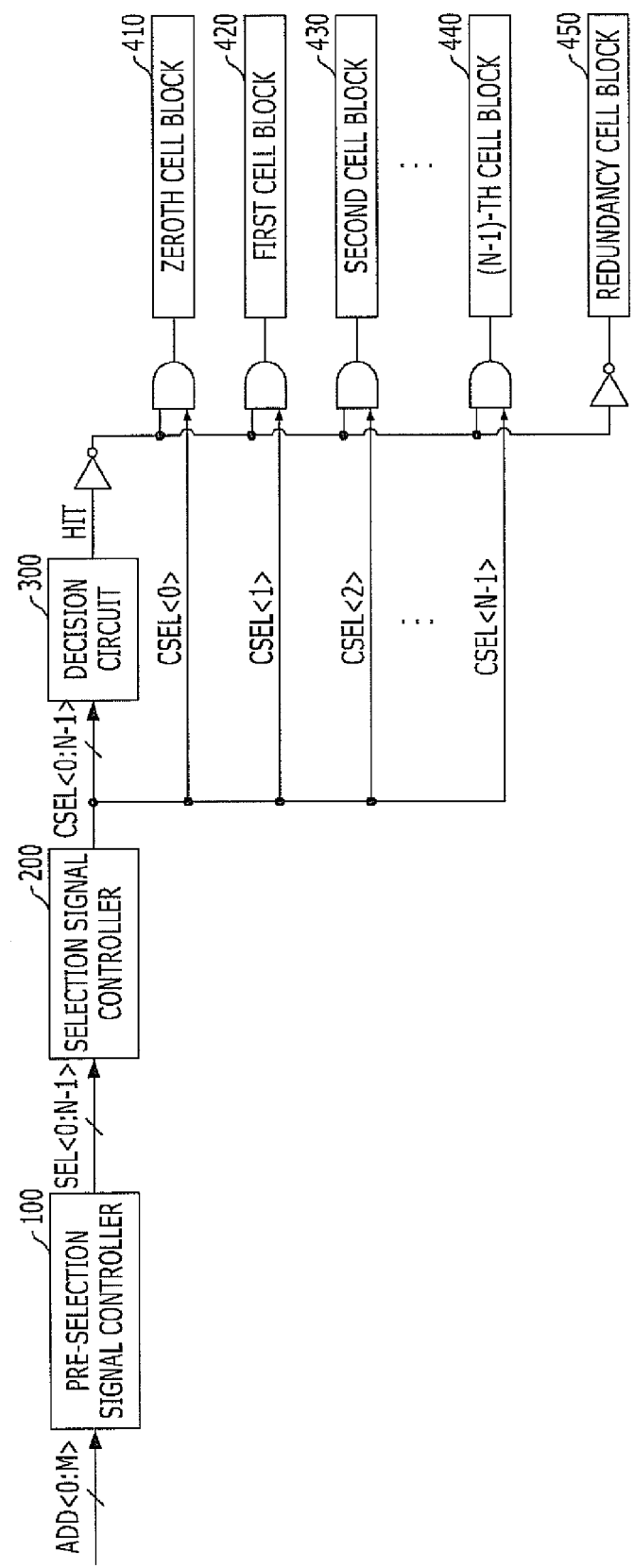
FIG. 1 is a block diagram illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor device in accordance with an embodiment of the present invention.

Referring to FIG. 1, the semiconductor device includes N cell blocks 410 to 440, a pre-selection signal generator 100, a selection signal controller 200 and a decision circuit 300, N being a natural number.

In a normal mode, the pre-selection signal generator 100 generates N pre-selection signals SEL<0:N-1> by decoding addresses ADD<0:M> inputted through address pins and activates, for example, only one of the generated pre-selection signals. Here, the N pre-selection signals SEL<0:N-1> correspond to the N cell blocks 410 to 440, respectively. In a multi-test mode, the pre-selection signal generator 100 generates the N pre-selection signals SEL<0:N-1> by decoding the addresses ADD<0:M> inputted through the address pins, and activates two or more of the pre-selection signals.

In the multi-test mode, the pre-selection signal generator 100 may simultaneously activate two or more of the N pre-selection signals SEL<0:N-1>. Hereinafter, for illustration purposes, a case where, in the multi-test mode, the pre-selection signal generator 100 generates four pre-selection signals SEL<0:3> respectively corresponding to four cell blocks 410 to 440 and simultaneously activates two of the four pre-selection signals SEL<0:3> will be described as an example. Specifically, a case where the pre-selection signal generator 100 simultaneously activates a zeroth pre-selection signal SEL<0> and a second pre-selection signal SEL<2> and simultaneously activates a first pre-selection signal SEL<1> and a third pre-selection signal SEL<3> when a test for a zeroth cell block 410 and a second cell block 430 is completed will be described as an example.

The selection signal controller 200 receives the N pre-selection signals SEL<0:N-1> inputted from the pre-selection signal generator 100 and outputs the inputted N pre-selection signals SEL<0:N-1> as N selection signals CSEL<0:N-1>. Here, the selection signal controller 200 outputs the N selection signals CSEL<0:N-1> by controlling the activation periods of the selection signals CSEL<0> and CSEL<2> respectively corresponding to the activated pre-selection signals SEL<0> and SEL<2> of the N pre-selection signals SEL<0:N-1> not to overlap. In the multi-test mode, a plurality of pre-selection signals SEL<0> and SEL<2> are simultaneously activated, and therefore, the activation periods of the activated pre-selection signals SEL<0> and SEL<2> overlap. Here, the selection signal controller 200 controls the activation periods of the selection signals CSEL<0> and CSEL<2> corresponding to the activated pre-selection signals SEL<0> and SEL<2>, respectively, so that the activation periods do not overlap.

For example, assuming that the activation period of a selection signal activated in the normal mode is T0, the selection signal controller 200 divides the activation period T0 into T1 and T2. Subsequently, the selection signal controller 200 may first control the zeroth selection signal CSEL<0> to be activated in the period T1 and subsequently control the second selection signal CSEL<2> to be activated in the period T2 after the period T1 is completed. The selection signals CSEL<0> and CSEL<2> of which activation periods are controlled not to overlap and the inactivated selection signals CSEL<1> and CSEL<3> are outputted to the decision circuit 300. In the normal mode, for example, only one pre-selection signal is activated (consequently, only one selection signal is activated), and therefore, it is unnecessary to control the activation period of the selection signal. Thus, according to an example, the selection signal controller 200 does not control the activation period of the selection signals CSEL<0:3> respectively corresponding to the pre-selection signals SEL<0:3> inputted in the normal mode; the selection signal controller 200 outputs the selection signals CSEL<0:3> to the decision circuit 300 as they are in the normal mode.

The decision circuit 300 decides the presence of repaired cell blocks respectively corresponding to activated selection signals using repair information stored therein and the N selection signals CSEL<0:N-1> outputted from the selection signal controller 200. Here, the repair information is information indicating a cell block among the N cell blocks 410 to 440, which is decided to have a defective cell through a defect-cell decision operation and replaced by a redundancy cell block 450. The decision circuit 300 decides whether or not the activated cell blocks 410 and 430 are repaired as the redundancy cell block 450 in response to the activated selection signals CSEL<0> and CSEL<2>. The decision circuit 300 may activate a hit signal HIT and output the activated hit signal HIT when it is determined that the cell blocks respectively corresponding to the activated selection signals CSEL<0> and CSEL<2> are repaired cell blocks and to inactivate the hit signal HIT when it is determined that the cell blocks respectively corresponding to the activated selection signals CSEL<0> and CSEL<2> are not repaired cell blocks. The decision circuit 300 will be specifically described below in connection with FIG. 2.

The four cell blocks 410 to 440 are activated in response to the four selection signals CSEL<0:3> corresponding thereto, respectively. Specifically, the cell block corresponding to the activated selection signal is activated when the hit signal HIT outputted from the decision circuit is in an inactivated state, and the redundancy cell block 450 is activated in place of the cell block corresponding to the activated selection signal when the hit signal HIT is in an activated state. For example, in the normal mode, if only the second selection signal CSEL<2> of the four selection signals CSEL<0:3> outputted from the selection signal controller 200 is activated and the second cell block 430 corresponding to the activated second selection signal CSEL<2> is a normal cell block which is not repaired (i.e., if the second cell block 430 is in a state that the hit signal HIT is inactivated), the second cell block 430 is activated in response to the activated second selection signal CSEL<2>. On the contrary, if the second cell block 430 is a repaired cell block (i.e., if the second cell block 430 is in a state that the hit signal HIT is activated), the second cell block 430 is not activated, and the redundancy cell block 450 is activated in place of the second cell block 430.

In the multi-test mode, it is assumed that the zeroth pre-selection signal SEL<0> and the second pre-selection signal SEL<2> of the four pre-selection signals SEL<0:3> are simultaneously activated by the pre-selection signal generator 100, and the zeroth selection signal CSEL<0> of the selection signals CSEL<0> and CSEL<2> respectively corresponding to the simultaneously activated two pre-selection signals SEL<0> and SEL<2> is first activated and the second selection signal CSEL<2> is subsequently activated. Here, it is assumed that the zeroth cell block 410 is a normal cell block and the second cell block 430 is repaired as the redundancy cell block 450. Then, since the zeroth cell block 410 corresponding to the zeroth selection signal CSEL<0> of which activation period precedes that of the second selection signal CSEL<2> is a normal cell block which is not repaired (i.e., the zeroth cell block 410 is in a state that the hit signal HIT is inactivated), the zeroth cell block 410 is activated in response to the activated zeroth selection signal CSEL<0>. A read (or write) operation is performed on the zeroth cell block 410. If the activation period of the zeroth selection signal CSEL<0> is completed, the second selection signal CSEL<2> is activated. Since the second cell block 430 corresponding to the second selection signal CSEL<2> is a repaired cell block (i.e., the second cell block 430 is in a state that the hit signal HIT is activated), the redundancy cell block 450 is activated in place of the second cell block 430. A read (or write) operation is performed on the redundancy cell block 450.

Figure 2:
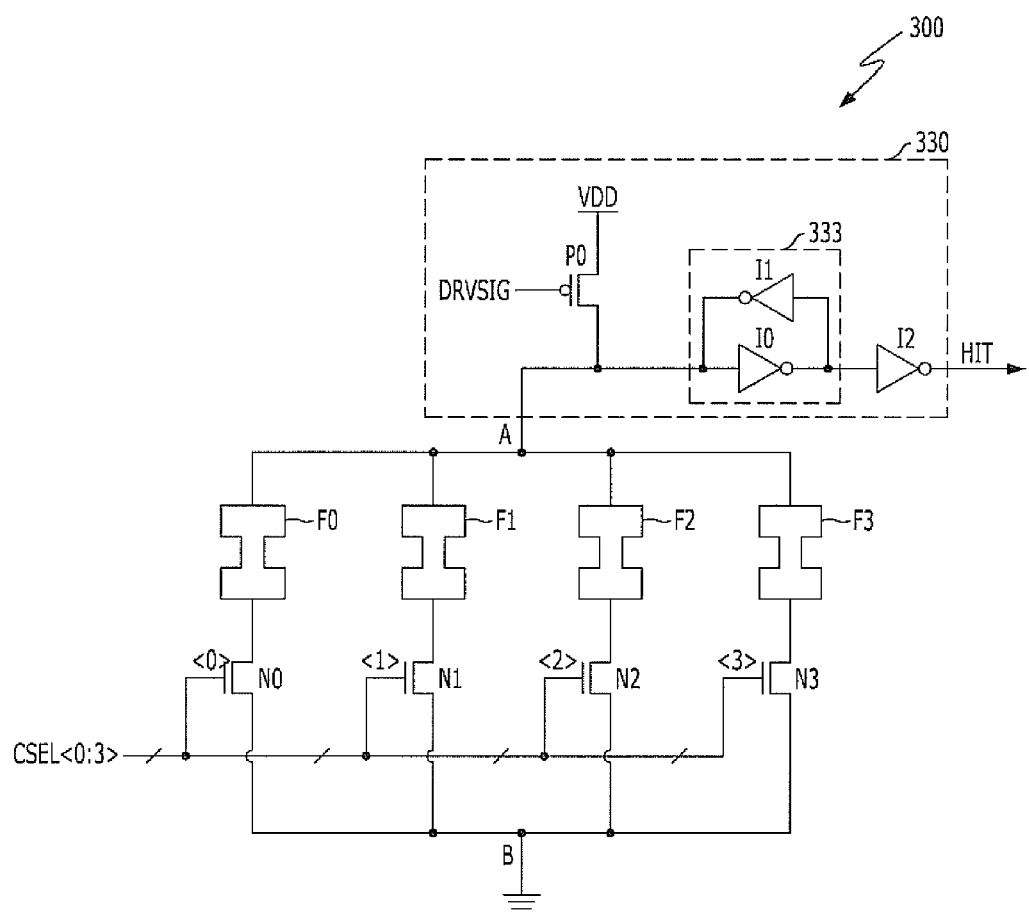
FIG. 2 is a circuit diagram illustrating an embodiment of a decision circuit illustrated in FIG. 1.

FIG. 2 is a circuit diagram illustrating an embodiment of the decision circuit 300 illustrated in FIG. 1.

Referring to FIG. 2, the decision circuit 300 performs an operation of receiving the N selection signals CSEL<0:N-1> respectively corresponding to the N cell blocks 410 to 440, inputted from the selection signal controller 200, and deciding whether or not a cell block corresponding to an activated selection signal is a repaired cell block. For illustration purposes, a case where the decision circuit 300 illustrated in FIG. 2 receives four selection signals CSEL<0:3> respectively corresponding to four cell blocks 410 to 440, inputted from the selection signal controller 200, and decides whether or not a cell block corresponding to an activated selection signal is a repaired cell block will be described as an example. Specifically, the decision circuit 300 includes four fuses F0 to F3 respectively corresponding to the four selection signals CSEL<0:3> outputted from the selection signal controller 200 and activates a hit signal HIT and outputs the activated hit signal HIT according to the presence of cutting of the fuses F0 and F2 respectively corresponding to the activated selection signals CSEL<0> and CSEL<2> of the inputted selection signals CSEL<0:3>. The four fuses F0 to F4 store repair information of the four cell blocks 410 to 440, respectively. For example, when the second cell block 430 having a defective cell is replaced by the redundancy cell block 450, the second fuse F2 corresponding to the second cell block 430 is cut, and the other fuses F0, F1 and F3 are not cut.

The decision circuit 300 may include four fuses F0 to F4 connected in parallel to a first node A, four switches N0 to N3 respectively connected in series to the four fuses F0 to F3, respectively, and an output unit 330 for outputting a hit signal HIT. One end of each of the four switches N0 to N3 is connected to a second node B, and the other ends of the four switches N0 to N3 are connected to the four fuses F0 to F3, respectively. The four switches N0 to N3 are turned on/off in response to the respective four selection signals CSEL<0:3> outputted from the selection signal controller 200. The output unit 330 activates the hit signal HIT and outputs the activated hit signal HIT when a fuse connected in series to the switch turned on in response to the activated selection signal of the selection signals CSEL<0:3> is cut and inactivates the hit signal HIT and outputs the inactivated high signal HIT when the fuse is not cut.

An operation of the decision circuit 300 will be described.

For illustration purposes, it is assumed that only zeroth selection signal CSEL<0> of the inputted selection signals CSEL<0:3> is activated and the second fuse F2 is cut. A driving control signal DRVSIG illustrated in FIG. 2 becomes a high level when an active command is inputted and becomes a low level when a pre-charge command is inputted. If the pre-charge command is inputted so that the driving control signal DRVSIG becomes a low level, a transistor P0 is turned on so that a power voltage VDD is supplied, and therefore, the voltage at the first node A becomes a high level. If the active command is inputted so that the driving control signal DRVSIG becomes a high level, the transistor P0 is turned off so that the power voltage VDD is not supplied. However, the voltage at the first node A is continuously maintained as a high level by a latch 333 composed of inverters 10 and 11. In this case, only the zeroth switch N0 is turned on in response to the inputted selection signals CSEL<0:3>, and the other switches N1, N2 and N3 are turned off. Since only the second fuse F2 is cut, a current path between the first and second nodes A and B is generated by the uncut zeroth fuse F0 and the turned-on zeroth switch N0. Therefore, current flows from the first node A to the second node B so that electric charges at the first node A are discharged. Thus, the voltage at the first node A becomes a low level so that the hit signal HIT is inactivated as a low level and subsequently outputted. That is, since the zeroth cell block 410 corresponding to the activated zeroth selection signal CSEL<0> is decided as a normal cell block which is not repaired, the zeroth cell block 410 is activated in response to the activated zeroth selection signal CSEL<0>. A read (or write) operation is performed on the activated zeroth cell block 410.

Meanwhile, a case where, for example, only the second cell block 430 is repaired as the redundancy cell block 450 so that only the second fuse F2 is cut and the other fuses F0, F1 and F3 are not cut, and the selection signals CSEL<0:3> are inputted to the decision circuit in the state that only the activated second selection signal CSEL<2> is activated and the other selection signals CSEL<0>, CSEL<1> and CSEL<3> are inactivated will be described as an example. The driving control signal DRVSIG is changed from a low level to a high level, so that the voltage at the first node A maintains a high-level state. In this case, the four switches N0, N1, N2 and N3 are turned on/off in response to the respective inputted selection signals CSEL<0:3>. Since only the second selection signal CSEL<2> is activated, only the second switch N2 is turned on, and the other switches N0, N1 and N3 are turned off. Since the second fuse F2 connected in series to the turned-on second switch N2 is cut and the other switches N0, N1 and N3 are turned off, a current path is not generated between the first and second nodes A and B. Thus, the voltage at the first node A is continuously maintained as a high-level state so that the hit signal HIT is activated as a high-level state and subsequently outputted. That is, the second cell block 430 corresponding to the activated second selection signal CSEL<2> is decided to be a repaired cell block so that the redundancy cell block 450 is activated in place of the second cell block 430. A read (or write) operation is performed on the redundancy cell block 450.

Here, the decision circuit 300 configured as illustrated in FIG. 2 performs an inaccurate decision operation when two or more activated selection signals having overlapped activation periods are inputted. For example, it is assumed that the zeroth and second selection signals CSEL<0> and CSEL<2> having overlapped activation periods are inputted, and the second cell block 430 is repaired as the redundancy block 450 so that only the second fuse F2 is cut (hereinafter, referred to as a third case). The zeroth switch N0 and the second switch N2 are turned on in response to the inputted selection signals CSEL<0:3>, and the other switches N1 and N3 are turned off. In this case, since, for example, only the second fuse F2 is cut, a current path between the first and second nodes A and B is generated by the uncut zeroth fuse F0 and the turned-on zeroth switch N0. Therefore, current flows from the first node A to the second node B so that electric charges at the first node A are discharged. Thus, the voltage at the first node A becomes a low level so that the hit signal HIT is inactivated as a low level and subsequently outputted. However, although the second cell block 430 corresponding to the activated second selection signal CSEL<2> is a repaired cell block, there occurs an error that the hit signal HIT is inactivated and outputted.

In order to prevent such an error, the selection signal controller 200 controls the activation periods of the activated selection signals CSEL<0> and CSEL<1> not to overlap and outputs the selection signals CSEL<0> and CSEL<1>. Therefore, for example, only one selection signal in an activation state (the other selection signals are in an inactivation state) is inputted to the decision circuit 300. That is, in the activation period T1, the selection signals CSEL<0:3> are inputted to the decision circuit 300 so that the zeroth selection signal CSEL<0> is activated and the other selection signals CSEL<1:3> are inactivated. In the activation period T2, the selection signals CSEL<0:3> are inputted to the decision circuit 300 so that, for example, only the second selection signal CSEL<2> is activated and the other selection signals CSEL<0>, CSEL<1> and CSEL<2> are inactivated.

When the activation periods of the selection signals CSEL<0> and CSEL<2> activated by the selection signal controller 200, the decision circuit 300 outputs an accurate hit signal HIT without an error in the third case. That is, in the activation period T1, the driving control signal DRVSIG is changed from a low level to a high level, so that the voltage at the first node A is maintained as a high level. If the selection signals CSEL<0:3> are inputted in the state that, for example, only the zeroth selection signal CSEL<0> is activated and the other selection signals CSEL<1:3> are inactivated, only the zeroth switch N0 is turned on and the other switches N1 to N3 are turned off. A current path between the first and second nodes A and B is generated by the turned-on zeroth switch N0 and the uncut zeroth fuse F0. Thus, the voltage at the first node A is dropped so that the hit signal HIT is inactivated as a low level and subsequently outputted. Accordingly, the zeroth cell block 410 is activated in response to the zeroth selection signal CSEL<0>, and a read (or write) operation is performed on the activated zeroth cell block 410. Subsequently, if the driving control signal DRVSIG is changed from a high level to a low level, the transistor P0 is turned on so that the power voltage VDD is supplied. Thus, the voltage at the first node A becomes a high level.

If the driving control signal DRVSIG is changed from a low level to a high level in the activation period T2, the transistor P0 is turned off, but the voltage at the first node A is maintained as a high level by the latch 333. If the selection signals CSEL<0:3> are inputted to the decision circuit 300 in the state that, for example, only the second selection signal CSEL<2> is activated and the other selection signals CSEL<0>, CSEL<1> and CSEL<3> are inactivated, only the second switch N2 is turned on, and the other switches N0, N1 and N3 are turned off. Since the second fuse F2 connected in series to the turned-on switch N2 is cut, and the other switches N0, N1 and N3 are turned off, a current path is not generated between the first and second nodes A and B. Thus, the voltage at the first node A is maintained as a high level so that the hit signal HIT is activated as a high level and subsequently outputted. Accordingly, the redundancy cell block 450 is activated in place of the second cell block 430, and a read (or write) operation is performed on the activated redundancy block 450.

Meanwhile, unlike the decision circuit 300, the decision circuit 300 may be designed so that the positions of the plurality of switches N0 to N3 and the positions of the fuses F0 to F3 are changed with each other. That is, the decision circuit 300 may have configuration where the first to fourth switches N0 to N3 are connected in parallel to the first node A, one end of each of the first to fourth fuses F0 to F3 is connected to the second node B, the other ends of the first to four fuses F0 to F3 are connected to the respective switches N0 to N3, and the output unit 330 is connected to the first node A.

Figure 3A:
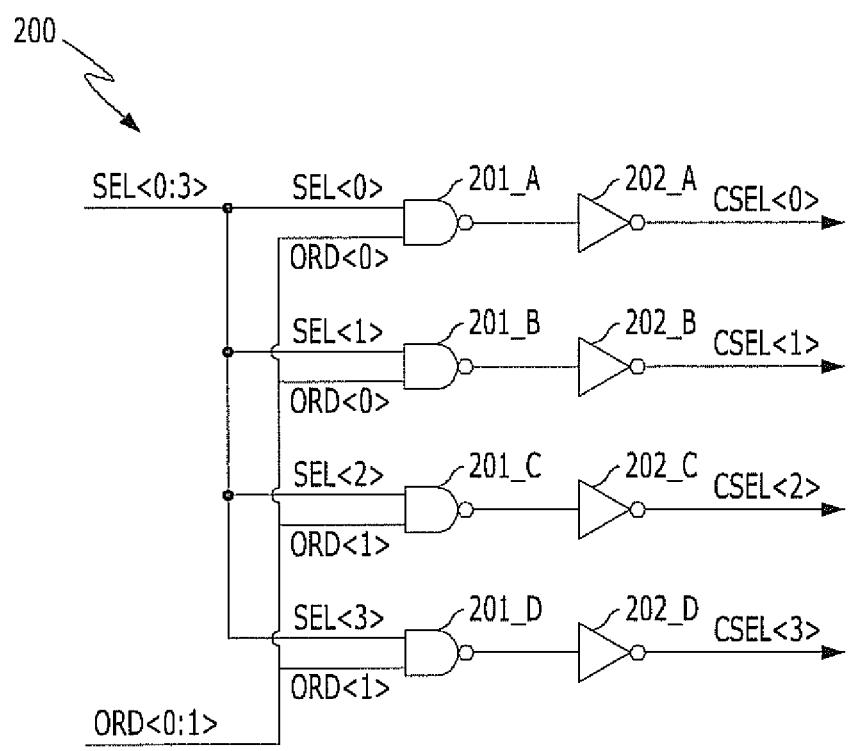
FIG. 3A is a circuit diagram illustrating a first embodiment of a selection signal controller illustrated in FIG. 1.

FIG. 3A is a circuit diagram illustrating a first embodiment of the selection signal controller 200 illustrated in FIG. 1.

Referring to FIG. 3A, the selection signal controller 200 controls the activation sequence of the selection signals CSEL<0> and CSEL<2> respectively corresponding to the activated pre-selection signals SEL<0> and SEL<2> of the inputted pre-selection signals SEL<0:3> in response to at least one sequence control signal ORD<0:1>. Here, the sequence control signal ORD<0:1> is a signal that controls the activation sequence of the selection signals CSEL<0> and CSEL<2> respectively corresponding to the simultaneously activated selection signals SEL<0> and SEL<2> so that the activation periods of the selection signals CSEL<0> and CSEL<2> do not overlap in the multi-test mode. Since only one pre-selection signal is activated and outputted to the selection signal controller 200 in the normal mode, the sequence control signal ORD<0:1> may be configured to be activated in the activation period T0. For illustration purposes, a case where the selection signal controller 200 illustrated in FIG. 3A controls the activation sequence of the selection signals CSEL<0> and CSEL<2> using two sequence control signals ORD<0:1> will be described as an example.

An operation of the selection signal controller 200 will be described.

In the multi-test mode, it is assumed that four pre-selection signals SEL<0:3> are generated by the pre-selection signal generator 100, two pre-selection signals SEL<0> and SEL<2> of the four pre-selection signals SEL<0:3> are simultaneously activated during an activation period T0, the activation period T0 is divided into activation periods T1 and T2, and first and second sequence control signals ORD<0> and ORD<1> are activated in the activation periods T1 and T2, respectively. Here, it is further assumed that the first sequence control signal ORD<0> controls the zeroth and first selection signals CSEL<0:1> to be activated in the activation period T1, and the second sequence control signal ORD<1> controls the second and third selection signals CSEL<2:3> to be activated in the activation period T2.

Specifically, if the zeroth pre-selection signal SEL<0> activated during the activation period T0 and the first sequence control signal ORD<0> activated during the activation period T1 are inputted to a first NAND gate 201_A, a signal is outputted, which becomes a low level during the activation period T1, in which the activation periods of both the signals overlap and the signals each become a high level during the other signal's activation period. If the signal outputted from the first NAND gate 201_A passes through a first inverter 202_A, the zeroth selection signal CSEL<0> is outputted, where the zeroth selection signal SEL<0> becomes a high level during the activation period T1 and becomes a low level during the other activation period. Since the first pre-selection signal SEL<1> is inactivated in the activation period T0, the first selection signal CSEL<1> inactivated in the activation period T0 is outputted even though the first selection signal CSEL<1> passes through a second NAND gate 201_B and a second inverter 202_B.

If the second pre-selection signal SEL<2> activated during the activation period T0 and the second sequence control signal ORD<1> activated during the activation period T2 are inputted to a third NAND gate 201_C, a signal is outputted, where the signal becomes a low level during the activation period T2, in which the activation periods of both signals overlap, and becomes a high level during the other activation period T1. If the signal outputted from the third NAND gate 201_C passes through a third inverter 202_C, the second selection signal CSEL<2> is outputted, where the second selection signal CSEL<2> becomes a high level during the activation period T2 and becomes a low level during the other activation period T1. Since the third pre-selection signal SEL<3> is inactivated in the activation period T0, the third selection signal CSEL<3> activated in the activation period T0 is outputted even though the third selection signal CSEL<3> passes through a fourth NAND gate 201_D and a fourth inverter 202D.

Thus, the selection signals CSEL<0> and CSEL<2> corresponding to the pre-selection signals SEL<0> and SEL<2> simultaneously activated during the activation period T0 are controlled to be activated in the activation periods T1 and T2, respectively. That is, the selection signals CSEL<0> and CSEL<2> are controlled so that the activation periods of the selection signals CSEL<0> and CSEL<2> do not overlap.

Now, an operation of the selection signal controller 200 in the normal mode will be described.

For illustration purposes, it is assumed that only the zeroth pre-selection signal SEL<0> is activated during the activation period T0 by the pre-selection signal generator 100, the other pre-selection signals SEL<1:3> are inactivated, and the sequence control signals ORD<0:1> are activated during the activation period T0. If the zeroth pre-selection signal SEL<0> activated during the activation period T0 and the first sequence control signal ORD<0> activated during the activation period T0 are inputted to the first NAND gate 201_A, a signal is outputted, where the signal becomes a low level during the activation period T0, in which the activation periods of both the signals overlap and becomes a high level during the activation periods of other pre-selection signals.

If the signal outputted from the first NAND gate 201_A passes through the first inverter 202_A, the zeroth selection signal CSEL<0> is outputted, which becomes a high level during the activation period T0 and becomes a low level during the activation periods of other pre-selection signals. Since the first to third pre-selection signals SEL<1:3> are inactivated in the activation period T0, the inactivated first to third selection signals CSEL<1:3> are outputted even though the first to third selection signals CSEL<1:3> pass through the NAND gates 201_B, 201_C and 201_D and the inverters 202_B, 202_C and 202_D.

Although it has been described above that the selection signal controller 200 controls the activation periods of the selection signals not to overlap using the two sequence control signals ORD<0:1>, the selection signal controller 200 may be configured to control the activation sequence of the selection signals using, for example, only one sequence control signal ORD<0>. According to an example, it is assumed that two pre-selection signals of the N pre-selection signals SEL<0:N-1> are simultaneously activated. The selection signal controller 200 may control zeroth to (N/02-1)-th selection signals CSEL<0:N/2-1> to be activated in the activation period T1 when the sequence control signal ORD<0> becomes a high level, and control (N/2)-th to (N-1)-th selection signals CSEL<N/2:N-1> to be activated in the activation period T2 when the sequence control signal ORD<0> becomes a low level. Similarly, the selection signal controller 200 may be configured to control the zeroth to (N/2-1)-th selection signals CSEL<0:N/2-1> to be activated in the activation period T1 when the sequence control signal ORD<0> becomes a low level and to control (N/2)-th to (N-1)-th selection signals CSEL<N/2:N-1> to be activated in the activation period T2 when the sequence control signal ORD<0> becomes a high level.

When P (P is a natural number of 2<P≤N) pre-selection signals of the N pre-selection signals SEL<0:N-1> are simultaneously activated, the selection signal controller 200 may be configured to control the activation sequence of the selection signals using P sequence control signals ORD<0:P-1>. For example, when four pre-selection signals SEL<0>, SEL<3>, SEL<6> and SEL<9> of 12 pre-selection signals SEL<0:11> are simultaneously activated, the activation period T0 is divided into four activation periods TA, TB, TC and TD. Subsequently, the selection signal controller 200 may control the activation sequence of selection signals using a first sequence control signal ORD<0> for controlling zeroth to second selection signals CSEL<0:2> to be activated in the activation period TA, a second sequence control signal ORD<1> for controlling third to fifth selection signals CSEL<3:5> to be activated in the activation period TB, a third sequence control signal ORD<2> for controlling sixth to eighth selection signals CSEL<6:8> to be activated in the activation period TC, and a fourth sequence control signal ORD<3> for controlling ninth to eleventh selection signals CSEL<9:11> to be activated in the activation period TD.

Figure 3B:
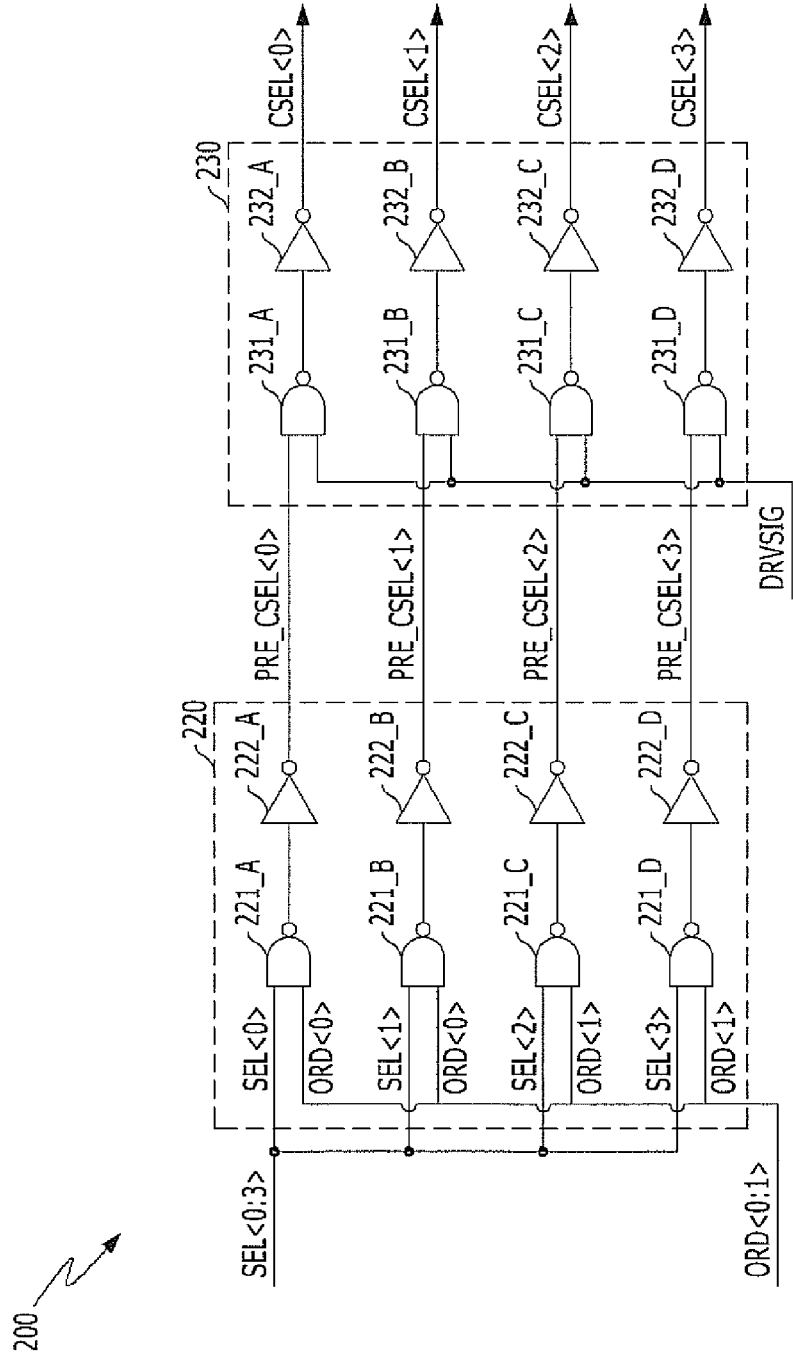
FIG. 3B is a circuit diagram illustrating a second embodiment of the selection signal controller illustrated in FIG. 1.

FIG. 3B is a circuit diagram illustrating a second embodiment of the selection signal controller 200 illustrated in FIG. 1.

Referring to FIG. 3B, the selection signal controller 200 illustrated is configured so that a period controller 230 is further added to the selection signal controller 200 illustrated in FIG. 3A. That is, the selection signal controller 200 may include an activation sequence controller 220 and the period controller 230. The configuration and operation of the activation sequence controller 220 are similar to those of the selection signal controller 200 illustrated in FIG. 3A.

The period controller 230 outputs selection signals CSEL<0:3> by controlling the lengths of activation periods of intermediate selection signals PRE_CSEL<0:3> of which activation sequence is controlled by the activation sequence controller 220 in response to the driving control signal DRVSIG. For example, if zeroth intermediate selection signal PRE_CSEL<0> controlled to be activated during the activation period T1 is inputted to the period controller 230, the length of the activation period of the zeroth intermediate selection signal PRE_CSEL<0> may be controlled so that the zeroth intermediate selection signal PRE_CSEL<0> is activated during an activation period T1_A (0<T1_A<T1) that overlaps the activation period of the driving control signal DRVSIG. The configuration and operation of the period controller 230 are similar to those of the activation sequence controller 220, except that the period controller 230 receives the driving control signal DRVSIG in place of the sequence control signals ORD<0:1>.

Figure 4:
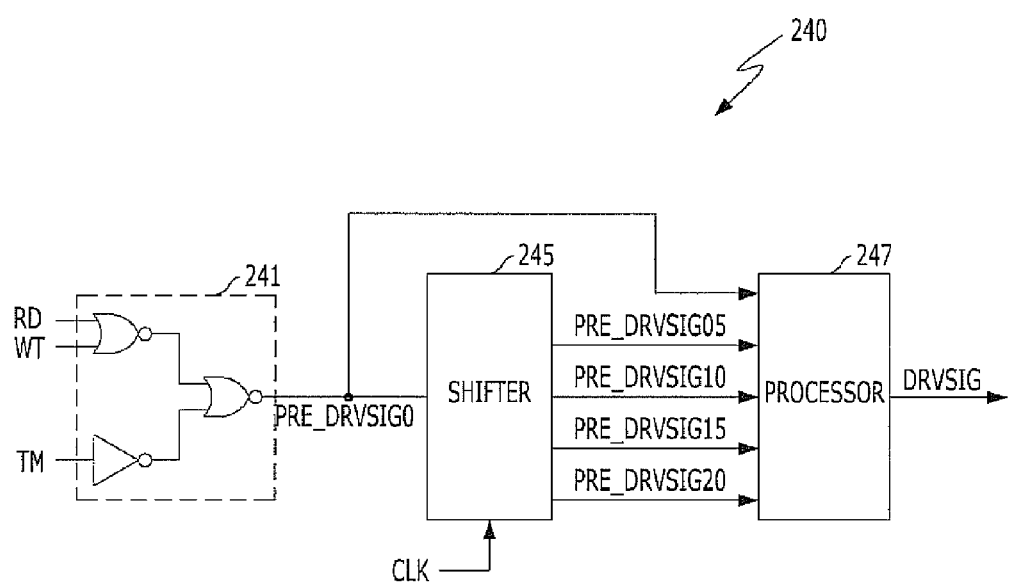
FIG. 4 is a block diagram illustrating an embodiment of a driving signal generator for generating a driving control signal, illustrated in FIG. 2.

FIG. 4 is a block diagram illustrating an embodiment of a driving signal generator 240 for generating the driving control signal DRVSIG, illustrated in FIG. 2.

Referring to FIG. 4, the driving control signal generator 240 for generating the driving control signal DRVSIG used in the multi-test mode is illustrated. The driving control signal DRVSIG used in the normal mode may be configured to be activated when an active command is inputted and to be inactivated when a pre-charge command is inputted. The driving control signal DRVSIG used in the multi-test mode may be generated using a read or write command. For example, a case where a driving control signal DRVSIG having a high pulse width of 3* a period (1tck) of an external clock and a low pulse width of 1*1tck is generated using a read command RD will be described. Here, the read command RD is a signal having a high pulse width of 1*tck. If a multi-test mode signal TM is activated, a pulse generator 241 generates a pre-driving signal PRE_DRVSIG0 having a high pulse width of 1*tck using the inputted read command RD and outputs the generated pre-driving signal PRE_DRVSIG0 to a shifter 245. The shifter 245 generates a pre-driving signal PRE_DRVSIG05 obtained by delaying the inputted PRE_DRVSIG0 by 1/2*tck, a pre-driving signal PRE_DRVSIG10 obtained by delaying the inputted pre-driving signal PRE_DRVSIG0 by 1*tck, a pre-driving signal PRE_DRVSIG15 obtained by delaying the inputted pre-driving signal PRE_DRVSIG0 by 3/2*tck, and a pre-driving signal PRE_DRVSIG20 obtained by delaying the inputted pre-driving signal PRE_DRVSIG0 by 2*tck, and outputs the generated signals to a processor 247. The shifter 245 may be configured as a D-flip flop. The processor 247 generates a driving control signal DRVSIG having a high pulse width of 3*tck and a low pulse width of 1*tck by combining high pulses of the inputted signals PRE_DRVSIG0, PRE_DRVSIG05, PRE_DRVSIG10, PRE_DRVSIG15 and PRE_DRVSIG20.

FIG. 5 is a timing diagram illustrating an entire operation of the semiconductor device illustrated in FIG. 1.

Referring to FIG. 5, in the normal mode, the pre-selection signal generator 100 generates four pre-selection signals SEL<0:3> and allows, for example, only one pre-selection signal SEL<0> of the generated pre-selection signals SEL<0:3> to be activated during the activation period T0. In the normal mode, the driving control signal DRVSIG may be configured to be activated during an activation period T0+α, which is slightly longer than the activation period T0. For example, when the zeroth pre-selection signal SEL<0> is activated and the other pre-selection signals SEL<1:3> are inactivated by the pre-selection signal generator 100, only one pre-selection signal SEL<0> of the pre-selection signals SEL<0:3> inputted to the selection signal controller 200 is activated, and therefore, the activation period of the zeroth selection signal CSEL<0> corresponding the zeroth pre-selection signal SEL<0> is not controlled. The zeroth selection signal CSEL<0> activated and the inactivated first to third selection signals CSEL<1:3> during the activation period T0 are transferred to the decision circuit 300. If the zeroth cell block 410 corresponding to the activated zeroth selection signal CSEL<0> is a normal cell block which is not repaired, the decision circuit 300 inactivates a hit signal HIT as a low level and subsequently outputs the inactivated hit signal HIT. If the hit signal HIT becomes a low level, the zeroth cell block 410 is activated in response to the zeroth selection signal CSEL<0>. A read (or write) operation is performed on the activated zeroth cell block 410. On the contrary, if the zeroth cell block 410 is a repaired cell block, the decision circuit 300 activates the hit signal HIT as a high level and subsequently outputs the activated hit signal HIT. If the hit signal HIT becomes a high level, the redundancy cell block (i.e., a cell block activated in place of the zeroth cell block 410) is activated in place of the zeroth cell block 410. A read (or write) operation is performed on the activated redundancy cell block.

In the multi-test mode, the pre-selection signal generator 100 generates four pre-selection signals SEL<0:3> by decoding inputted addresses ADD<0:M>. Subsequently, the pre-selection signal generator 100 simultaneously activates two pre-selection signals SEL<0> and SEL<2> of the generated pre-selection signals SEL<0:3> and outputs the activated pre-selection signals SEL<0> and SEL<2> to the selection signal controller 200. Hereinafter, a case where the second cell block 430 is repaired as the redundancy cell block 450 will be described as an example. For illustration purposes, it is assumed that the selection signal controller 200 includes the activation sequence controller 220 and the period controller 230 shown in FIG. 3B, and the two sequence control signals ORD<0:1> are used.

The activation sequence controller 220 controls the zeroth intermediate selection signal PRE_CSEL<0> to be activated during the activation period T1 (4*1tck) using the first sequence control signal ORD<0>, and controls the second intermediate selection signal PRE_CSEL<2> to be activated during the activation period T2 (4*1tck) using the second sequence control signal ORD<1>. The intermediate selection signals PRE_CSEL<0:3> having activation periods that are controlled not to overlap one another by the activation sequence controller 220 may have the lengths of the activation periods controlled by the period controller 230. It is assumed that the driving control signal generator 240 generates a driving control signal DRVSIG having a high pulse width of 3*1tck (for example, a period where the pulse is at a high logic level) and a low pulse width of 1*tck (for example, a period where the pulse is at a low logic level) in the multi-test mode. For example, the length of the activation period of the zeroth intermediate selection signal PRE_CSEL<0> is controlled to be 3*1tck by the period controller 230, and the length of the activation period of the second intermediate selection signal PRE_CSEL<2> is controlled to be 3*1tck by the period controller 230. Subsequently, the zeroth and second intermediate selection signals PRE_CSEL<0> and PRE_CSEL<2> are outputted to the decision circuit 300. The selection signals CSEL<0:3>. The selection signals CSEL<0:3> outputted from the selection signal controller 200 are inputted to the decision circuit 300. The voltage at the first node in the decision circuit 300 becomes a high level. Since, for example, only the zeroth selection signal CSEL<0> of the selection signals CSEL<0:3> inputted to the decision circuit 300 is activated during the activation period T1, the decision circuit 300 decides whether or not the zeroth cell block is a repaired cell block. The zeroth switch N0 in the decision circuit 300 is turned on in response to the zeroth selection signal CSEL<0>. Since the zeroth fuse F0 connected in series to the turned-on zeroth switch N0 is not cut, a current path is generated between the first and second nodes A and B. Thus, the voltage at the first node A is changed from a high level to a low level so that the hit signal HIT is inactivated as a low level and subsequently outputted. As a result, since the zeroth cell block 410 is decided as a cell block which is not repaired, the zeroth cell block 410 is activated in response to the activated zeroth selection signal CSEL<0>. A read (or write) operation is performed on the activated zeroth cell block 410.

The driving control signal DRVSIG becomes a low level during 1*tck of the activation period T1 so that the voltage at the first node A in the decision circuit 300 is changed from a low level to a high level. In the activation period T1, the driving control signal DRVSIG becomes a high level during 3*tck. In this case, the voltage at the first node A is changed depending on the selection signals CSEL<0:3> inputted to the decision circuit 300 and the presence of cutting of the fuses F0 to F3. Since, for example, only the second selection signal CSEL<2> of the selection signals CSEL<0:3> inputted to the decision circuit 300 is activated during the activation period T1, the decision circuit 300 decides whether or not the second cell block 430 is a repaired cell block. The second switch N2 in the decision circuit 300 is turned on in response to the second selection signal CSEL<2>, but the fuse F2 connected in series to the turned-on second switch N2 is cut and the other switches N0, N1 and N3 are turned off. Therefore, a current path is not generated between the first and second nodes A and B. Since the voltage at the first node A is maintained as a high level, the hit signal HIT is activated as a high level and subsequently outputted. That is, since the second cell block 430 is a repaired cell block, the redundancy cell block 450 is activated. A read (or write) operation is performed on the activated redundancy cell block 450.

In accordance with embodiments of the present invention, a multi-test operation is properly performed even after a defective cell block is repaired, thereby reducing testing time and cost.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a plurality of cell blocks activated in response to a plurality of selection signals, respectively;
   a pre-selection signal generator configured to generate a plurality of pre-selection signals corresponding to the cell blocks, respectively, and simultaneously activate at least two of the pre-selection signals by decoding addresses in a multi-test mode;
   a selection signal controller configured to selectively activate the plurality of selection signals by controlling active periods of the simultaneously activated pre-selection signals so as not to overlap in response to a sequence control signal and a driving control signal; and
   a decision circuit configured to decide whether or not the activated cell blocks are repaired in response to stored repair information and the activated selection signals.

2. The semiconductor device of claim 1, wherein the decision circuit comprises a plurality of fuses corresponding to the selection signals, respectively, and the decision unit is configured to activate a first signal in response to cut states of fuses corresponding to the activated selection signals.

3. The semiconductor device of claim 2, wherein one of the fuses corresponding to a repaired cell block of the plurality of cell blocks is cut and the other fuses are not cut.

4. The semiconductor device of claim 1, wherein the decision circuit comprises:
   a plurality of fuses connected in parallel to a first node;
   a plurality of switches that each have one node connected to a second node and another node connected to a corresponding one of the plurality of fuses and are turned on/off in response to the plurality of selection signals, respectively; and
   an output unit configured to activate a first signal a selected one of the switches is turned on in response to the activated selection signals and the respective fuse connected in series to the switch is cut and inactivate the first signal when the fuse is not cut.

5. The semiconductor device of claim 1, wherein the decision circuit comprises:
   a plurality of switches connected in parallel to a first node, wherein each of the switches is turned on/off in response to a corresponding one of the plurality of selection signals;
   a plurality of fuses that each have one node connected to a second node and another node connected to one of the switches; and
   an output unit configured to activate a first signal when a selected one of the switches is turned on in response to the activated selection signals and the respective fuse connected in series to the switch is cut and inactivate the first signal when the fuse is not cut.

6. The semiconductor device of claim 4, wherein the output unit comprises:
   a pre-charger configured to pre-charge a voltage at the first node at a first level in response to a driving control signal; and
   a driver configured to maintain the voltage at the first node at the first level and activate the first signal when the fuse connected in series to the selected switch is cut and change the voltage at the first node from the first level to a second level when the fuse is not cut.

7. The semiconductor device of claim 6, wherein
   the second node is connected to a ground node, and the first and second levels are high and low levels, respectively; and
   the driver is configured to maintain the voltage at the first node at a high level and activate the hit signal when the fuse connected in series the selected switch is cut and drop the voltage at the first node from the high level to a low level when the fuse is not cut.

8. The semiconductor device of claim 1, wherein each of the plurality of cell blocks comprises at least one word line.

9. The semiconductor device of claim 1, wherein the selection signal controller is configured to control the activated selection signals to be sequentially activated and outputted.

10. The semiconductor device of claim 1, wherein the selection signal controller comprises:
    an activation sequence controller configured to control an activation sequence of the activated selection signals in response to at least one sequence control signal; and
    a period controller configured to control lengths of activation periods of the activated selection signals, wherein an activation sequence of the activated selection signals is controlled by the activation sequence controller in response to the driving control signal.

11. The semiconductor device of claim 10, wherein the driving control signal is generated using a read or write command.

12. The semiconductor device of claim 10, further comprising the driving control signal generator including:
    a pulse generator configured to generate a pulse signal in response to a read or write command in the multi-test mode;
    a shifter configured to shift the pulse signal and output the shifted pulse signal; and
    a processor configured to generate the driving control signal by combining the pulse signal and the shifted pulse signal.

13. A testing method of a semiconductor device having a plurality of cell blocks that are activated in response a plurality of selection signals, respectively, the method comprising:
    generating a plurality of pre-selection signals corresponding to the cell blocks, respectively, and simultaneously activating at least two of the pre-selection signals by decoding addresses in a multi-test mode;
    selectively activating the selection signals by controlling active periods of the simultaneously activated pre-selection signals so as not to overlap in response to a sequence control signal and a driving control signal; and
    deciding whether or not the activated cell blocks are repaired in response to stored repair information stored and the activated selection signals.

14. The method of claim 13, wherein the selectively activating of the selection signals comprises:
    selectively activating the plurality of selection signals in response to the plurality of pre-selection signals;
    generating the sequence control signal for controlling an activation sequence of the activated selection signals; and controlling the activated selection signals to be sequentially activated in response to the sequence control signal.

15. The method of claim 13, further comprising:
controlling lengths of the activation periods of the activated selection signals in response to the driving control signal after the controlling of active periods of the activated selection signals so as not to overlap.

16. The method of claim 15, wherein the driving control signal is generated using a read or write command.

17. The method of claim 15, further comprising:
generating a pulse signal in response to a read or write command in the multi-test mode;
shifting the pulse signal to output the shifted pulse signal; and
generating the driving control signal by combining the pulse signal and the shifted pulse signal.

18. A semiconductor device comprising:
a driving control signal generator configured to generate a driving control signal in response to a read or write command in a test mode;
a pre-selection signal generator configured to generate a plurality of pre-selection signals, and simultaneously activate at least two of the pre-selection signals by decoding addresses in the test mode;
a selection signal controller configured to selectively activate a plurality of selection signals by controlling active periods of the simultaneously activated pre-selection signals so as not to overlap in response to sequence control signal and the driving control signal; and
a decision circuit configured to receive the plurality of selection signals to decide a logic level of a hit signal in response to stored repair information and the driving control signal.

19. The semiconductor device of claim 18, wherein the driving control signal generator comprises:
a pulse generator configured to generate a pulse signal in response to the read or write command in the test mode;
a shifter configured to shift the pulse signal and output the shifted pulse signal; and
a processor configured to generate the driving control signal by combining the pulse signal and the shifted pulse signal.

20. The semiconductor device of claim 18, wherein the selection signal controller comprises:
an activation sequence controller configured to control an activation sequence of the activated selection signals in response to at least one sequence control signal; and
a period controller configured to control lengths of activation periods of the activated selection signals, wherein an activation sequence of the activated selection signals is controlled by the activation sequence controller in response to the driving control signal.

* * * * *